United States Patent
Padiyath et al.

(10) Patent No.: US 7,940,004 B2
(45) Date of Patent: May 10, 2011

(54) FLEXIBLE HIGH-TEMPERATURE ULTRABARRIER

(75) Inventors: Raghunath Padiyath, Woodbury, MN (US); Mark A. Roehrig, Stillwater, MN (US); Fred B. McCormick, Maplewood, MN (US); Khanh T. Huynh, Eagan, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 36 days.

(21) Appl. No.: 12/617,818

(22) Filed: Nov. 13, 2009

(65) Prior Publication Data
US 2010/0073936 A1    Mar. 25, 2010

Related U.S. Application Data

(60) Continuation of application No. 12/363,457, filed on Jan. 30, 2009, which is a division of application No. 11/272,929, filed on Nov. 14, 2005, now Pat. No. 7,486,019, which is a division of application No. 10/405,284, filed on Apr. 2, 2003, now Pat. No. 7,018,713.

(51) Int. Cl.
*H01J 1/62* (2006.01)
*H01J 63/04* (2006.01)
(52) U.S. Cl. ........ 313/512; 313/498; 313/506; 313/238; 313/292
(58) Field of Classification Search .................. 313/498, 313/504, 506, 512, 238, 292; 445/23–25
See application file for complete search history.

(56) References Cited

U.S. PATENT DOCUMENTS

| | | | |
|---|---|---|---|
| 4,537,814 A | 8/1985 | Itoh et al. |
| 4,696,719 A | 9/1987 | Bischoff |
| 4,722,515 A | 2/1988 | Ham |
| 4,842,893 A | 6/1989 | Yializis et al. |
| 4,954,371 A | 9/1990 | Yializis |
| 5,018,048 A | 5/1991 | Shaw et al. |
| 5,032,461 A | 7/1991 | Shaw et al. |
| 5,097,800 A | 3/1992 | Shaw et al. |
| 5,125,138 A | 6/1992 | Shaw et al. |
| 5,356,947 A | 10/1994 | Ali et al. |
| 5,440,446 A | 8/1995 | Shaw et al. |
| 5,530,581 A | 6/1996 | Cogan |
| 5,547,908 A | 8/1996 | Furuzawa et al. |
| 5,681,666 A | 10/1997 | Treger et al. |

(Continued)

FOREIGN PATENT DOCUMENTS
EP    0 777 280 B1    6/1997
(Continued)

OTHER PUBLICATIONS

D. G. Shaw et al., "A New Vapor Deposition Process for Coating Paper and Polymer Webs", 6th International Vacuum Coating Conference (1992), pp. 96-102.

(Continued)

*Primary Examiner* — Joseph L Williams
*Assistant Examiner* — Kevin Quarterman

(57) ABSTRACT

A flexible barrier assembly having a flexible visible light-transmissive substrate having a Tg greater than or equal to that of heat-stabilized polyethylene terephthalate ("HSPET") overcoated with a first polymer layer having a Tg greater than or equal to that of HSPET and further overcoated with at least two visible light-transmissive inorganic barrier layers separated by at least one second polymer layer having a Tg greater than or equal to that of HSPET can be used to mount, cover, encapsulate or form moisture- and oxygen-sensitive articles such as organic light emitting devices and light valves.

3 Claims, 4 Drawing Sheets

U.S. PATENT DOCUMENTS

| | | |
|---|---|---|
| 5,686,360 A | 11/1997 | Harvey, III et al. |
| 5,736,207 A | 4/1998 | Walther et al. |
| 6,004,660 A | 12/1999 | Topolski et al. |
| 6,045,864 A | 4/2000 | Lyons et al. |
| 6,083,628 A | 7/2000 | Yializis |
| 6,146,225 A | 11/2000 | Sheats et al. |
| 6,214,422 B1 | 4/2001 | Yializis |
| 6,231,939 B1 | 5/2001 | Shaw et al. |
| 6,268,694 B1 | 7/2001 | Fujimoto |
| 6,358,570 B1 | 3/2002 | Affinito |
| 6,413,645 B1 | 7/2002 | Graff et al. |
| 6,492,026 B1 | 12/2002 | Graff et al. |
| 6,497,598 B2 | 12/2002 | Affinito |
| 6,570,325 B2 | 5/2003 | Graff et al. |
| 6,573,652 B1 | 6/2003 | Graff et al. |
| 6,623,861 B2 | 9/2003 | Martin et al. |
| 6,888,305 B2 | 5/2005 | Weaver |
| 6,975,067 B2 | 12/2005 | McCormick et al. |
| 2002/0022156 A1 | 2/2002 | Bright |
| 2002/0176993 A1 | 11/2002 | Graff et al. |
| 2003/0108749 A1 | 6/2003 | Ram |
| 2003/0148128 A1 | 8/2003 | Tomaru et al. |
| 2003/0213967 A1 | 11/2003 | Forrest et al. |
| 2004/0121146 A1 | 6/2004 | He et al. |

FOREIGN PATENT DOCUMENTS

| | | |
|---|---|---|
| JP | 1-283136 | 11/1989 |
| JP | 4-14440 | 1/1992 |
| JP | 6-316728 | 11/1994 |
| JP | 11-255923 | 9/1999 |
| JP | 2002-205354 | 7/2002 |
| JP | 2002-532850 | 10/2002 |
| JP | 2003-053881 | 2/2003 |
| WO | WO 97/16053 A1 | 5/1997 |
| WO | WO 00/26973 A1 | 5/2000 |
| WO | WO 02/090107 A1 | 11/2002 |
| WO | WO 03/016589 A1 | 2/2003 |

OTHER PUBLICATIONS

D. G. Shaw et al., "A New High Speed Process for Vapor Depositing Acrylate Thin Films: An Update", Society of Vacuum Coaters 36th Annual Technical Conference Proceedings (1993), pp. 348-352.

D. G. Shaw et al., "Use of Vapor Deposited Acrylate Coatings to Improve the Barrier Properties of Metallized Film", Society of Vacuum Coaters 37th Annual Technical Conference Proceedings (1994), pp. 240-247.

D. G. Shaw et al., "Use of Evaporated Acrylate Coatings to Smooth the Surface of Polyester and Polypropylene Film Substrates", RadTech (1996), pp. 701-707.

J. Affinito et al., "Vacuum deposited polymer/metal multilayer films for optical application", Thin Solid Films 270, 43-48 (1995).

J.D. Affinito et al., "Polymer-Oxide Transparent Barrier Layers", Society of Vacuum Coaters 39th Annual Technical Conference Proceedings (1996), pp. 1-6.

M.A. Roehrig et al., "Vacuum Heat Transfer Model for Web Substrates", 43rd Annual Technical Conference Proceedings of the Society of Vacuum Coaters, pp. 335-341 (2000).

Clark Bright and Mark Roehrig, "Transparent and Conductive Ultrabarrier Coatings for Flexible Plastic Displays", Abstract, American Vacuum Society, 46th International Symposium, Conference Proceedings 1999 (Co-Authored Presentation).

Clark Bright and Mark Roehrig, "Transparent Barrier Coatings Based on ITO for Flexible Plastic Displays", Proceedings of the Thirteenth International Conference on Vacuum Web Coatings, 18 pages, 1999.

Clark Bright and Mark Roehrig, "Advances in Vacuum Web Coating", Abstract, Proceedings of the 1999 AIMCAL Fall Technical Conference Proceedings, 1999.

Clark Bright and Mark Roehrig, "New Applications for Polymer Multi-Layer Technology", Conference Proceedings AIMCAL Fall Technical Meeting, 1998.

Ron Jones et al., "An Improved Metallized Film Capacitor Using a New Acrylate Coating Process", J. Plastic Film and Sheeting, vol. 13, 150-158 (1997).

FLEXIBLE HIGH-TEMPERATURE ULTRABARRIER

This is a continuation of application Ser. No. 12/363,457, filed Jan. 30, 2009 which is a divisional of application Ser. No. 11/272,929, filed Nov. 14, 2005 now U.S. Pat. No. 7,486,019, now allowed, which is a divisional of Ser. No. 10/405,284, filed Apr. 2, 2003, issued as U.S. Pat. No. 7,018,713, the disclosure of which is herein incorporated by reference.

This invention relates to barrier films and electronic devices.

BACKGROUND

Organic light emitting devices (OLEDs) can suffer reduced output or premature failure when exposed to water vapor or oxygen. Metals and glasses have been used to encapsulate and prolong the life of OLED devices, but metals typically lack transparency and glass lacks flexibility. Intensive efforts are underway to find alternative encapsulation materials for OLEDs and other electronic devices. A flexible polymeric barrier film that exhibited low permeability to water vapor and oxygen would be especially useful, but despite intense industrial effort only limited success has been attained thus far. References relating to flexible barrier films include U.S. Pat. No. 5,440,446 (Shaw et al.), U.S. Pat. No. 5,530,581 (Cogan), U.S. Pat. No. 5,681,666 (Treger et al.), U.S. Pat. No. 5,686,360 (Harvey, III et al.), U.S. Pat. No. 5,736,207 (Walther et al.), U.S. Pat. No. 6,004,660 (Topolski et al.), U.S. Pat. No. 6,083,628 (Yializis), U.S. Pat. No. 6,146,225 (Sheats et al.), U.S. Pat. No. 6,214,422 (Yializis), U.S. Pat. No. 6,268,695 (Affinito), U.S. Pat. No. 6,358,570 (Affinito), U.S. Pat. No. 6,413,645 (Graff et al.), U.S. Pat. No. 6,492,026 (Graff et al.) and U.S. Pat. No. 6,497,598 (Affinito), U.S. Pat. No. 6,497,598 B2 (Affinito), U.S. Pat. No. 6,570,325 B2 (Graff et al.), U.S. Pat. No. 6,623,861 B2 (Martin et al.) and US 2002/0176993 A1 (Graff et al.); European Patent No. EP 0 777 280 B1 (Motorola, Inc.) and PCT Published Application No. WO 97/16053 (Robert Bosch GmbH). The Walther et al. patent describes a barrier assembly for plastic containers, with the lowest reported oxygen transmission rate being 0.375 cc/m²/day/bar.

SUMMARY OF THE INVENTION

The present invention provides, in one aspect, a barrier assembly (sometimes referred to below as a "barrier film") comprising a flexible visible light-transmissive substrate having a glass transition temperature ("Tg") greater than or equal to that of heat-stabilized polyethylene terephthalate ("HSPET") overcoated with a first polymer layer having a Tg greater than or equal to that of HSPET and further overcoated with at least two visible light-transmissive inorganic barrier layers separated by at least one second polymer layer having a Tg greater than or equal to that of HSPET, the barrier assembly having an oxygen transmission rate less than 0.005 cc/m²/day at 23° C. and 90% RH.

In another aspect, the invention provides a process for making a barrier assembly comprising:

providing a flexible light-transmissive support having a Tg greater than or equal to that of HSPET;

forming a first polymer layer having a Tg greater than or equal to that of HSPET atop the support;

forming a visible light-transmissive first inorganic barrier layer atop the first polymer layer;

forming a second polymer layer having a Tg greater than or equal to that of HSPET atop the first inorganic barrier layer; and forming a visible light-transmissive second inorganic barrier layer atop the second polymer layer wherein the barrier assembly has an oxygen transmission rate less than 0.005 cc/m²/day at 23° C. and 90% RH.

In a further aspect, the invention provides a display or illuminating device comprising a moisture- or oxygen-sensitive light source or light valve at least partially covered with a barrier assembly comprising a flexible visible light-transmissive substrate having a Tg greater than or equal to that of HSPET overcoated with a first polymer layer having a Tg greater than or equal to that of HSPET and further overcoated with at least two visible light-transmissive inorganic barrier layers separated by at least one second polymer layer having a Tg greater than or equal to that of HSPET.

These and other aspects of the invention will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWING

Like reference symbols in the various figures of the drawing indicate like elements. The elements in the drawing are not to scale.

DETAILED DESCRIPTION

By using words of orientation such as "atop", "on", "uppermost" and the like for the location of various layers in the barrier assemblies or devices of the invention, we refer to the relative position of one or more layers with respect to a horizontal support layer. We do not intend that the barrier assemblies or devices should have any particular orientation in space during or after their manufacture.

By using the term "overcoated" to describe the position of a layer with respect to a substrate or other element of a barrier assembly of the invention, we refer to the layer as being atop the substrate or other element, but not necessarily contiguous to either the substrate or the other element. By using the term "separated by" to describe the position of a polymer layer with respect to two inorganic barrier layers, we refer to the polymer layer as being between the inorganic barrier layers but not necessarily contiguous to either inorganic barrier layer.

By using the term "polymer", we refer to homopolymers and copolymers, as well as homopolymers or copolymers that may be formed in a miscible blend, e.g., by coextrusion or by reaction, including, e.g., transesterification. The term "copolymer" includes both random and block copolymers. The term "cured polymer" includes both crosslinked and uncrosslinked polymers. The term "crosslinked" polymer refers to a polymer whose polymer chains are joined together by covalent chemical bonds, usually via crosslinking molecules or groups, to form a network polymer. A crosslinked polymer is generally characterized by insolubility, but may be swellable in the presence of an appropriate solvent.

By using the term "Tg", we refer to the glass transition temperature of a cured polymer when evaluated in bulk rather than in a thin film form. In instances where a polymer can only be examined in thin film form, the bulk form Tg can usually be estimated with reasonable accuracy. Bulk form Tg values usually are determined by evaluating the rate of heat flow vs. temperature using differential scanning calorimetry (DSC) to determine the onset of segmental mobility for the polymer and the inflection point (usually a second-order transition) at which the polymer can be said to change from a glassy to a rubbery state. Bulk form Tg values can also be estimated using a dynamic mechanical thermal analysis (DMTA) technique, which measures the change in the modulus of the polymer as a function of temperature and frequency of vibration.

By using the term a "visible light-transmissive" support, layer, assembly or device, we mean that the support, layer, assembly or device has an average transmission over the visible portion of the spectrum, $T_{vis}$, of at least about 20%, measured along the normal axis.

Figure 1:
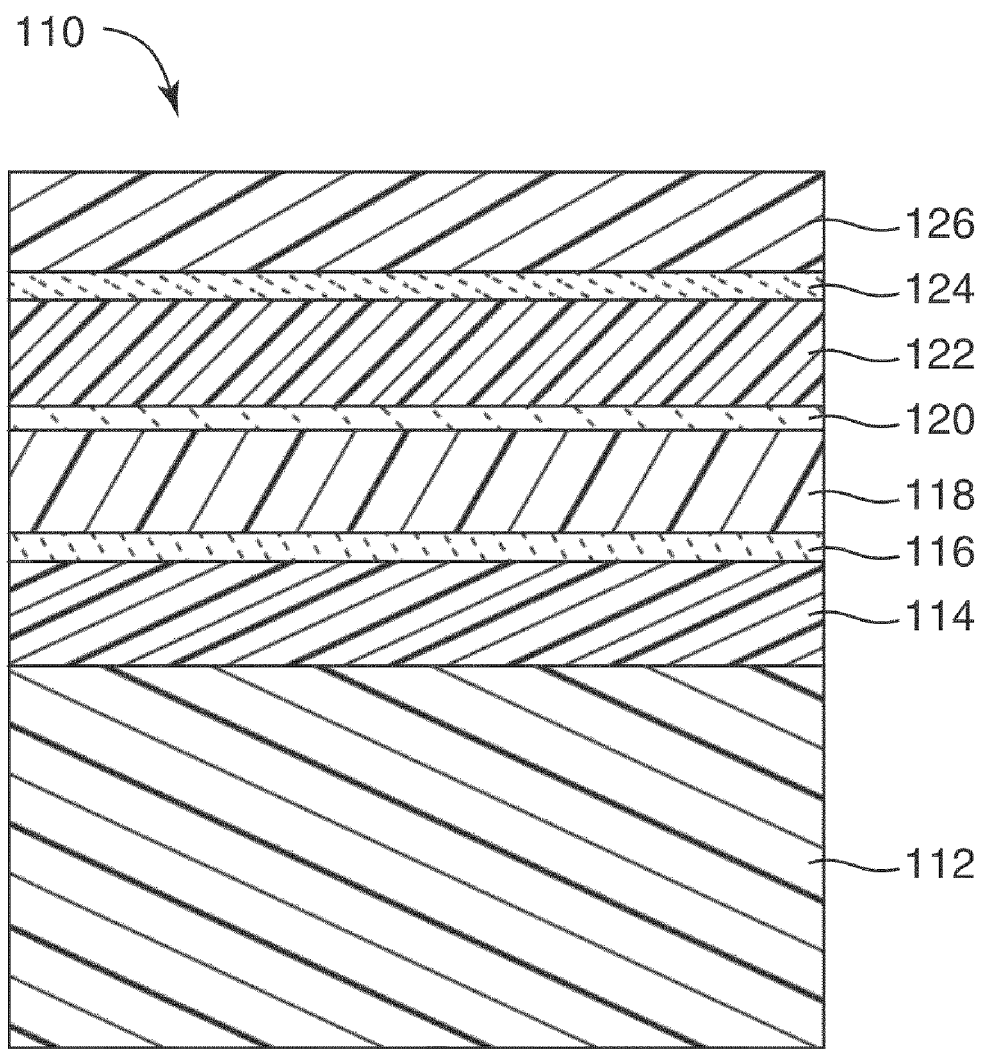
FIG. 1 is a schematic cross-sectional view of a disclosed barrier assembly.

Referring to FIG. 1, a barrier assembly is shown generally at 110. Assembly 110 includes support 112 made of a visible light-transmissive, flexible plastic film having a Tg greater than or equal to that of HSPET (Tg=about 78° C.). Support 112 is overcoated with a polymer layer 114 having a Tg greater than or equal to that of HSPET and further overcoated with two or more visible light-transmissive inorganic barrier layers such as layers 116, 120 and 124 separated by polymer layers such as layers 118 and 122. Assembly 110 also preferably includes a protective polymer overlayer 126 atop uppermost visible light-transmissive inorganic barrier layer 124.

Figure 2:
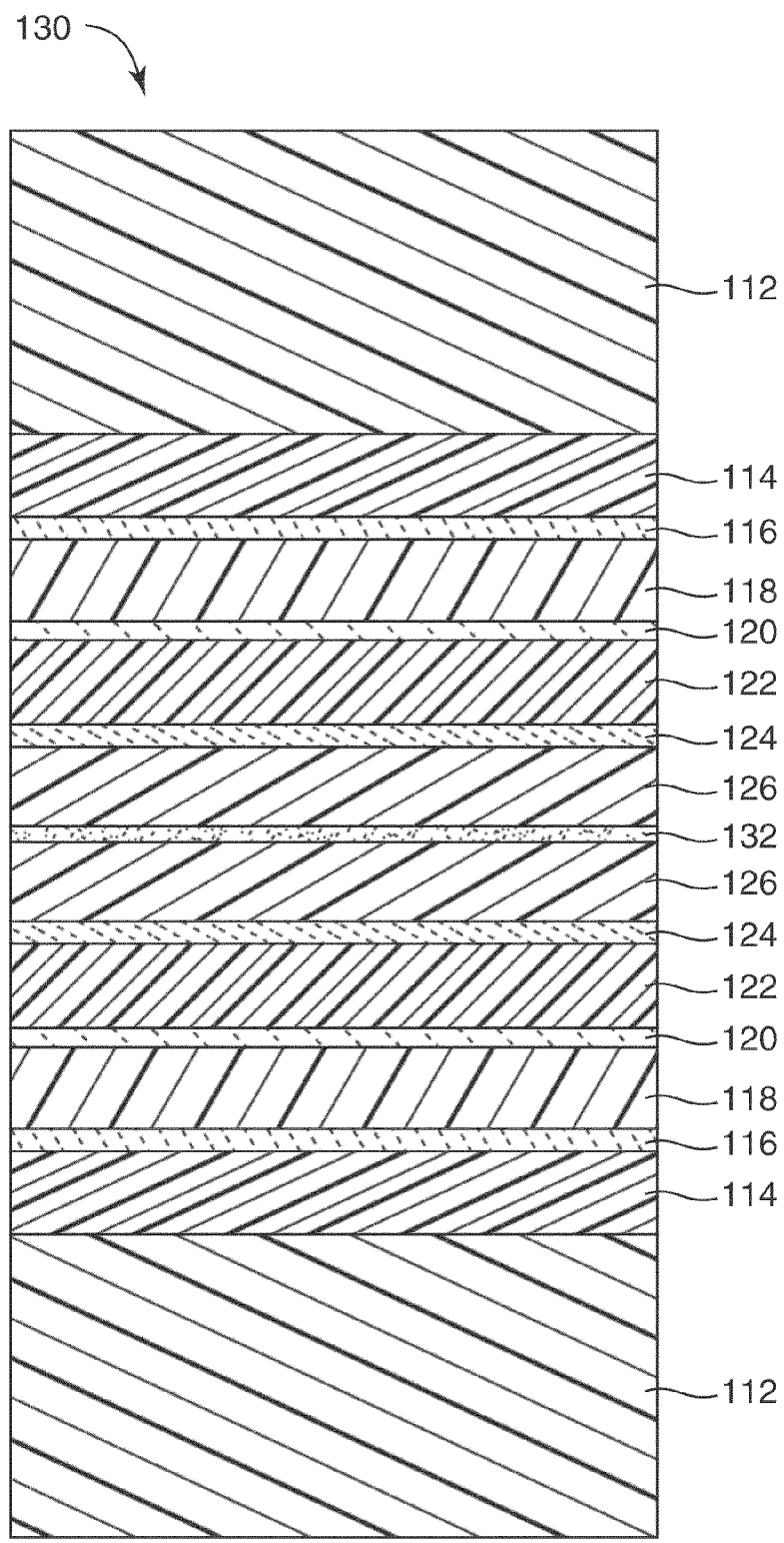
FIG. 2 is a schematic cross-sectional view of a disclosed laminated barrier assembly.

FIG. 2 shows a laminated barrier assembly 130 that can be made by laminating together two pieces of assembly 110 in face-to-face relationship using a layer of visible light-transmissive adhesive 132.

Preferred flexible light-transmissive supports 112 have a visible light transmission of at least about 70% at 550 nm. Preferably the support is heat-stabilized, using heat setting, annealing under tension or other techniques that will discourage shrinkage up to at least the heat stabilization temperature when the support is not constrained. If the support has not been heat stabilized, then it preferably has a Tg greater than that of polymethyl methacrylate ("PMMA", Tg=105° C.). More preferably the support has a Tg of at least about 110° C., yet more preferably at least about 120° C., and most preferably at least about 128° C. In addition to HSPET, particularly preferred supports include other heat-stabilized high Tg polyesters, PMMA, styrene/acrylonitrile ("SAN", Tg=110° C.), styrene/maleic anhydride ("SMA", Tg=115° C.), polyethylene naphthalate ("PEN", Tg=about 120° C.), polyoxymethylene ("POM", Tg=about 125° C.), polyvinylnaphthalene ("PVN", Tg=about 135° C.), polyetheretherketone ("PEEK", Tg=about 145° C.), polyaryletherketone ("PAEK", Tg=145° C.), high Tg fluoropolymers (e.g., DYNEON™ HTE terpolymer of hexafluoropropylene, tetrafluoroethylene, and ethylene, Tg=about 149° C.), polycarbonate ("PC", Tg=about 150° C.), poly α-methyl styrene (Tg=about 175° C.), polyarylate ("PAR", Tg=190° C.), polysulfone ("PSul", Tg=about 195° C.), polyphenylene oxide ("PPO", Tg=about 200° C.), polyetherimide ("PEI", Tg=about 218° C.), polyarylsulfone ("PAS", Tg=220° C.), poly ether sulfone ("PES", Tg=about 225° C.), polyamideimide ("PAI", Tg=about 275° C.), polyimide (Tg=about 300° C.) and polyphthalamide (heat deflection temp of 120° C.). For applications where material costs are important, supports made of HSPET and PEN are especially preferred. For applications where barrier performance is paramount, supports made of more expensive materials may be employed. Preferably the support has a thickness of about 0.01 to about 1 mm, more preferably about 0.05 to about 0.25 mm.

A first polymer layer having a Tg greater than or equal to that of HSPET lies atop the support. A variety of polymer materials can be employed. Volatilizable monomers that form suitably high Tg polymers are especially preferred. Preferably the first polymer layer has a Tg greater than that of PMMA, more preferably a Tg of at least about 110° C., yet more preferably at least about 150° C., and most preferably at least about 200° C. Especially preferred monomers that can be used to form the first layer include urethane acrylates (e.g., CN-968, Tg=about 84° C. and CN-983, Tg=about 90° C., both commercially available from Sartomer Co.), isobornyl acrylate (e.g., SR-506, commercially available from Sartomer Co., Tg=about 88° C.), dipentaerythritol pentaacrylates (e.g., SR-399, commercially available from Sartomer Co., Tg=about 90° C.), epoxy acrylates blended with styrene (e.g., CN-120S80, commercially available from Sartomer Co., Tg=about 95° C.), di-trimethylolpropane tetraacrylates (e.g., SR-355, commercially available from Sartomer Co., Tg=about 98° C.), diethylene glycol diacrylates (e.g., SR-230, commercially available from Sartomer Co., Tg=about 100° C.), 1,3-butylene glycol diacrylate (e.g., SR-212, commercially available from Sartomer Co., Tg=about 101° C.), pentaacrylate esters (e.g., SR-9041, commercially available from Sartomer Co., Tg=about 102° C.), pentaerythritol tetraacrylates (e.g., SR-295, commercially available from Sartomer Co., Tg=about 103° C.), pentaerythritol triacrylates (e.g., SR-444, commercially available from Sartomer Co., Tg=about 103° C.), ethoxylated (3) trimethylolpropane triacrylates (e.g., SR-454, commercially available from Sartomer Co., Tg=about 103° C.), ethoxylated (3) trimethylolpropane triacrylates (e.g., SR-454HP, commercially available from Sartomer Co., Tg=about 103° C.), alkoxylated trifunctional acrylate esters (e.g., SR-9008, commercially available from Sartomer Co., Tg=about 103° C.), dipropylene glycol diacrylates (e.g., SR-508, commercially available from Sartomer Co., Tg=about 104° C.), neopentyl glycol diacrylates (e.g., SR-247, commercially available from Sartomer Co., Tg=about 107° C.), ethoxylated (4) bisphenol a dimethacrylates (e.g., CD-450, commercially available from Sartomer Co., Tg=about 108° C.), cyclohexane dimethanol diacrylate esters (e.g., CD-406, commercially available from Sartomer Co., Tg=about 110° C.), isobornyl methacrylate (e.g., SR-423, commercially available from Sartomer Co., Tg=about 110° C.), cyclic diacrylates (e.g., IRR-214, commercially available from UCB Chemicals, Tg=about 208° C.) and tris (2-hydroxy ethyl) isocyanurate triacrylate (e.g., SR-368, commercially available from Sartomer Co., Tg=about 272° C.), acrylates of the foregoing methacrylates and methacrylates of the foregoing acrylates.

The first polymer layer can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The first polymer layer can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most preferably, the first polymer layer is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of each polymer layer and its adhesion to the underlying layer preferably is enhanced by appropriate pretreatment. A preferred pretreatment regimen employs an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric layer. Plasma pretreatment is particularly preferred. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the first polymer layer will depend in part on the nature and surface topography of the support. The thickness preferably is sufficient to provide a smooth, defect-free surface to which the subsequent first inorganic barrier layer can be applied. For example, the first polymer layer may have a thickness of a few nm (e.g., 2 or 3 nm) to about 5 micrometers, and can be thicker if desired.

At least two visible light-transmissive inorganic barrier layers separated by a polymer layer having a Tg greater than or equal to that of HSPET lie atop the first polymer layer. These layers can respectively be referred to as the "first inorganic barrier layer", "second inorganic barrier layer" and "second polymer layer". Additional inorganic barrier layers and polymer layers can be present if desired, including polymer layers that do not have a Tg greater than or equal to that of HSPET. Preferably however each neighboring pair of inorganic barrier layers is separated only by a polymer layer or layers having a Tg greater than or equal to that of HSPET, and more preferably only by a polymer layer or layers having a Tg greater than that of PMMA.

The inorganic barrier layers do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers preferably are formed using techniques employed in the film metallizing art such as sputtering (e.g., cathode or planar magnetron sputtering), evaporation (e.g., resistive or electron beam evaporation), chemical vapor deposition, plating and the like. Most preferably the inorganic barrier layers are formed using sputtering, e.g., reactive sputtering. Enhanced barrier properties have been observed when the inorganic layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy, leading to a lower void fraction as a result of compaction. The smoothness and continuity of each inorganic barrier layer and its adhesion to the underlying layer can be enhanced by pretreatments (e.g., plasma pretreatment) such as those described above with reference to the first polymer layer.

The inorganic barrier layers do not have to have the same thickness. The desired chemical composition and thickness of each inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm.

In addition to its barrier function, all or a portion of one or more of the visible light-transmissive inorganic barrier layers can be used for purposes such as an electrode (if suitably conductive) or a touch-sensitive surface. This can be facilitated by leaving a portion of a layer exposed or by connecting a layer to a lead, circuit trace or other electronic element.

The second polymer layers that separate the first, second and any additional inorganic barrier layers do not have to be the same, and do not all have to have the same thickness. A variety of second polymer layer materials can be employed. Preferred second polymer layer materials include those mentioned above with respect to the first polymer layer. Preferably the second polymer layer or layers are applied by flash evaporation and vapor deposition followed by crosslinking in situ as described above with respect to the first polymer layer. A pretreatment such as those described above (e.g., plasma pretreatment) preferably also is employed prior to formation of a second polymer layer. The desired chemical composition and thickness of the second polymer layer or layers will depend in part on the nature and surface topography of the underlying layer(s). The second polymer layer thickness preferably is sufficient to provide a smooth, defect-free surface to which a subsequent inorganic barrier layer can be applied. Typically the second polymer layer or layers may have a lower thickness than the first polymer layer. For example, each second polymer layer may have a thickness of about 5 nm to about 10 micrometers, and can be thicker if desired.

Preferably the barrier assemblies have a protective polymer topcoat. This topcoat can be referred to as the "third polymer layer". Volatilizable (meth)acrylate monomers are preferred for use in the third polymer layer, with volatilizable acrylate monomers having a Tg greater than or equal to that of HSPET being especially preferred (e.g., those mentioned above with respect to the first and second polymer layers) and volatilizable acrylate monomers having a Tg greater than PMMA being most preferred. If desired, the third polymer layer can be applied using conventional coating methods such as roll coating (e.g., gravure roll coating) or spray coating (e.g., electrostatic spray coating), then crosslinked using, for example, UV radiation. Most preferably the third polymer layer is formed by flash evaporation, vapor deposition and crosslinking of a monomer as described above with respect to the first and second polymer layers. A pretreatment such as those described above (e.g., plasma pretreatment) preferably also is employed prior to formation of the third polymer layer. The desired chemical composition and thickness of the third polymer layer will depend in part on the nature and surface topography of the underlying layer(s), the hazards to which the barrier assembly might be exposed, and applicable device requirements. The third polymer layer thickness preferably is sufficient to provide a smooth, defect-free surface that will protect the underlying layers from ordinary hazards. Typically the third polymer layer may have a lower thickness than the first polymer layer and a greater thickness than the second polymer layer or layers. For example, the third polymer layer may have a thickness of about 5 nm to about 10 micrometers, and can be thicker if desired.

Preferred barrier assemblies have a sufficient number of inorganic barrier layers and the substrate and first and second polymer layers preferably have a sufficiently high Tg so that the barrier assembly will be visible light-transmissive and will have a water vapor transmission rate (WVTR) less than about 0.005 g/m$^2$/day at 38° C. and 100% relative humidity, more preferably less than about 0.005 g/m$^2$/day at 50° C. and 100% relative humidity and most preferably less than about 0.005 g/m$^2$/day at 85° C. and 100% relative humidity. Transparency values (Tvis, determined by averaging the percent transmission T between 400 nm and 700 nm) of at least about 20%, more preferably at least about 60% are preferred.

Figure 3:
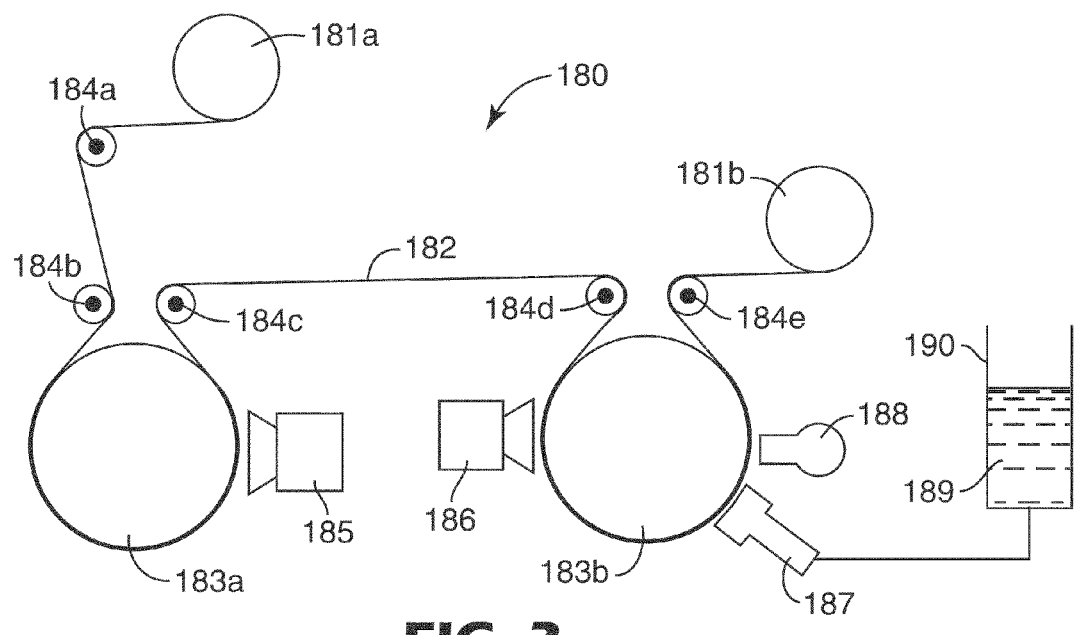
FIG. 3 is a schematic view of an apparatus for carrying out the disclosed process.

FIG. 3 shows a preferred apparatus 180 that can be used for roll-to-roll manufacture of barrier assemblies of the invention. Powered rolls 181a and 181b move supporting web 182 back and forth through apparatus 180. Temperature-controlled rotating drums 183a and 183b, and idler rolls 184a, 184b, 184c, 184d and 184e carry web 182 past metal sputtering applicator 185, plasma pretreater 186, monomer evaporator 187 and E-beam crosslinking device 188. Liquid monomer 189 is supplied to evaporator 187 from reservoir 190. Successive layers or pairs of layers can be applied to web 182 using multiple passes through apparatus 180. Additional applicators, pretreaters, evaporators and crosslinking devices can be added to apparatus 180, e.g., along the periphery of drums 183a and 183b, to enable sequential deposition of several pairs of layers. Apparatus 180 can be enclosed in a suitable chamber (not shown in FIG. 3) and maintained under vacuum or supplied with a suitable inert atmosphere in order to discourage oxygen, water vapor, dust and other atmospheric contaminants from interfering with the various pretreatment, monomer coating, crosslinking and sputtering steps.

Various functional layers or coatings can be added to the barrier assemblies of the invention to alter or improve their physical or chemical properties, particularly at the surface of the barrier film. Such layers or coatings can include, for example, visible light-transmissive conductive layers or electrodes (e.g., of indium tin oxide); antistatic coatings or films; flame retardants; UV stabilizers; abrasion resistant or hardcoat materials; optical coatings; anti-fogging materials; magnetic or magneto-optic coatings or films; photographic emulsions; prismatic films; holographic films or images; adhesives such as pressure sensitive adhesives or hot melt adhesives; primers to promote adhesion to adjacent layers; and low adhesion backsize materials for use when the barrier assembly is to be used in adhesive roll form. These functional components can be incorporated into one or more of the outermost layers of the barrier assembly or can be applied as a separate film or coating.

For some applications, it may be desirable to alter the appearance or performance of the barrier assembly, such as by laminating a dyed film layer to the barrier assembly, applying a pigmented coating to the surface of the barrier assembly, or including a dye or pigment in one or more of the materials used to make the barrier assembly. The dye or pigment can absorb in one or more selected regions of the spectrum, including portions of the infrared, ultraviolet or visible spectrum. The dye or pigment can be used to complement the properties of the barrier assembly, particularly where the barrier assembly transmits some frequencies while reflecting others.

The barrier assembly can be treated with, for example, inks or other printed indicia such as those used to display product identification, orientation information, advertisements, warnings, decoration, or other information. Various techniques can be used to print on the barrier assembly, such as, for example, screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

Figure 4:
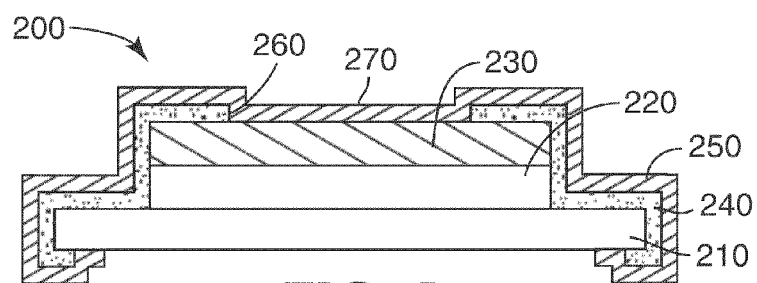
FIG. 4 is a schematic cross-sectional view of a disclosed OLED device.

The barrier assemblies of the invention can be used to inhibit the transmission of moisture vapor, oxygen or other gases in a variety of applications. The barrier assemblies of the invention are especially useful for encapsulating OLEDs, light valves such as liquid crystal displays (LCDs) and other electronic devices. A representative encapsulated OLED device 200 of the invention is shown in FIG. 4. The front or light-emitting side of device 200 faces downward in FIG. 4. Device 200 includes a visible light-transmissive barrier assembly 210 of the invention having an outer ITO layer (not shown in FIG. 4, but oriented so that it would face upward) that serves as an anode. Light emitting structure 220 is formed on barrier assembly 210 in contact with the outer ITO layer. Structure 220 contains a plurality of layers (not individually shown in FIG. 4) that cooperate to emit light downward through barrier assembly 210 when suitably electrically energized. Device 200 also includes conductive cathode 230 and metallic foil surround 250. Foil surround 250 is adhered to the back, sides and part of the front of device 220 by adhesive 240. An opening 260 formed in adhesive 240 permits a portion 270 of foil 250 to be deformed into contact with cathode 230. Another opening in foil 250 (not shown in FIG. 4) permits contact to be made with the anode formed by the outer ITO layer of barrier assembly 210. Metal foil 250 and barrier assembly 210 largely prevent water vapor and oxygen from reaching light emitting structure 220.

The invention will now be described with reference to the following non-limiting examples, in which all parts and percentages are by weight unless otherwise indicated.

EXAMPLE 1

A polyethylene naphthalate ("PEN") support film was covered with a stack of acrylate and indium tin oxide ("ITO") layers arranged in a seven layer alternating acrylate/ITO/acrylate/ITO/acrylate/ITO/acrylate configuration. The individual layers were formed as follows:

(Layer 1) A 91 meter long roll of 0.127 mm thick×508 mm wide KALADEX™ 1020 PEN film (commercially available from Dupont-Teijin Films, Tg=120° C.) was loaded into a roll-to-roll vacuum processing chamber. The chamber was pumped down to a pressure of $8 \times 10^{-6}$ torr. The film was treated with a nitrogen plasma operating at 600 W using a titanium cathode, using a web speed of 9.1 meters/min and maintaining the backside of the film in contact with a coating drum chilled to 0° C. Immediately after the plasma treatment and while the film was still in contact with the drum, the plasma-treated film surface was coated with an acrylate mixture prepared by combining 97% IRR-214 cyclic diacrylate (commercially available from UCB Chemicals, Tg=208° C.) with 3% EBECRYL™ 170 acrylated acidic adhesion promoter (commercially available from UCB Chemicals). The acrylate mixture was vacuum degassed prior to coating, and pumped at a flow rate of 3.0 ml/min through an ultrasonic atomizer operated at a frequency of 60 kHz (commercially available from Sonotek Corp.) into a heated vaporization chamber maintained at 275° C. The resulting monomer vapor stream condensed onto the plasma-treated film surface, and was electron beam-crosslinked using a single filament operated at 8 kV and 2.5 milliamps to form a 426 nm thick acrylate layer.

(Layer 2) The web direction was reversed inside the chamber, and an ITO inorganic oxide layer was sputter deposited atop a 20 meter length of the acrylate-coated web surface using a 90% $In_2O_3$/10% $SnO_2$ target (commercially available from Umicore Indium Products). The ITO was sputtered using 1500 watts of power, a gas mixture containing 134 sccm argon and 3.0 sccm oxygen at a pressure of 3 millitorr, and a web speed of 0.55 meters/minute to provide a 48 nm thick ITO layer deposited atop the Layer 1 acrylate.

(Layer 3) The web direction was again reversed. A second acrylate layer was coated and crosslinked on the same 20 meter web length using the same general conditions as for Layer 1, but with these exceptions. Plasma treatment was performed at 3000 W using a titanium cathode and the Layer 2 argon/oxygen gas mixture, and the monomer flow rate was 1.1 ml/min. This provided a 104 nm thick acrylate layer atop Layer 2.

(Layer 4) The web direction was again reversed. Using the same conditions as for Layer 2, a 48 nm thick ITO layer was deposited atop Layer 3.

(Layer 5) The web direction was again reversed. Using the same conditions for Layer 3, a 104 nm thick acrylate layer was coated atop Layer 4.

(Layer 6) The web direction was again reversed. Using the same conditions as for Layer 2, a 48 nm thick ITO layer was deposited atop Layer 5.

(Layer 7) The web direction was again reversed. Using the same conditions for Layer 3, a 104 nm thick acrylate layer was coated atop Layer 6.

The resulting seven layer stack (not counting the substrate) exhibited an average spectral transmission Tvis=50% (determined by averaging the percent transmission T between 400 nm and 700 nm) measured at a 30° angle of incidence, and a water vapor transmission rate (determined in accordance with ASTM F-129 at 85° C. and 100% RH) that was below the 0.005 $g/m^2$/day lower detection limit rate of a MOCON PERMATRAN-W™ 3/31 WVTR testing system (commercially available from MOCON Inc). The film also exhibited an oxygen transmission rate (determined in accordance with ASTM D-3985 and evaluated with either side of the film facing the test gas) that was below the 0.005 $cc/m^2$/day lower detection limit rate of a MOCON OXTRAN™ 2/20 oxygen transmission rate testing system (commercially available from MOCON Inc) when evaluated at 38° C. and 90% RH, and below an average value of 0.030 $cc/m^2$/day when evaluated at 50° C. and 90% RH.

Figure 5:
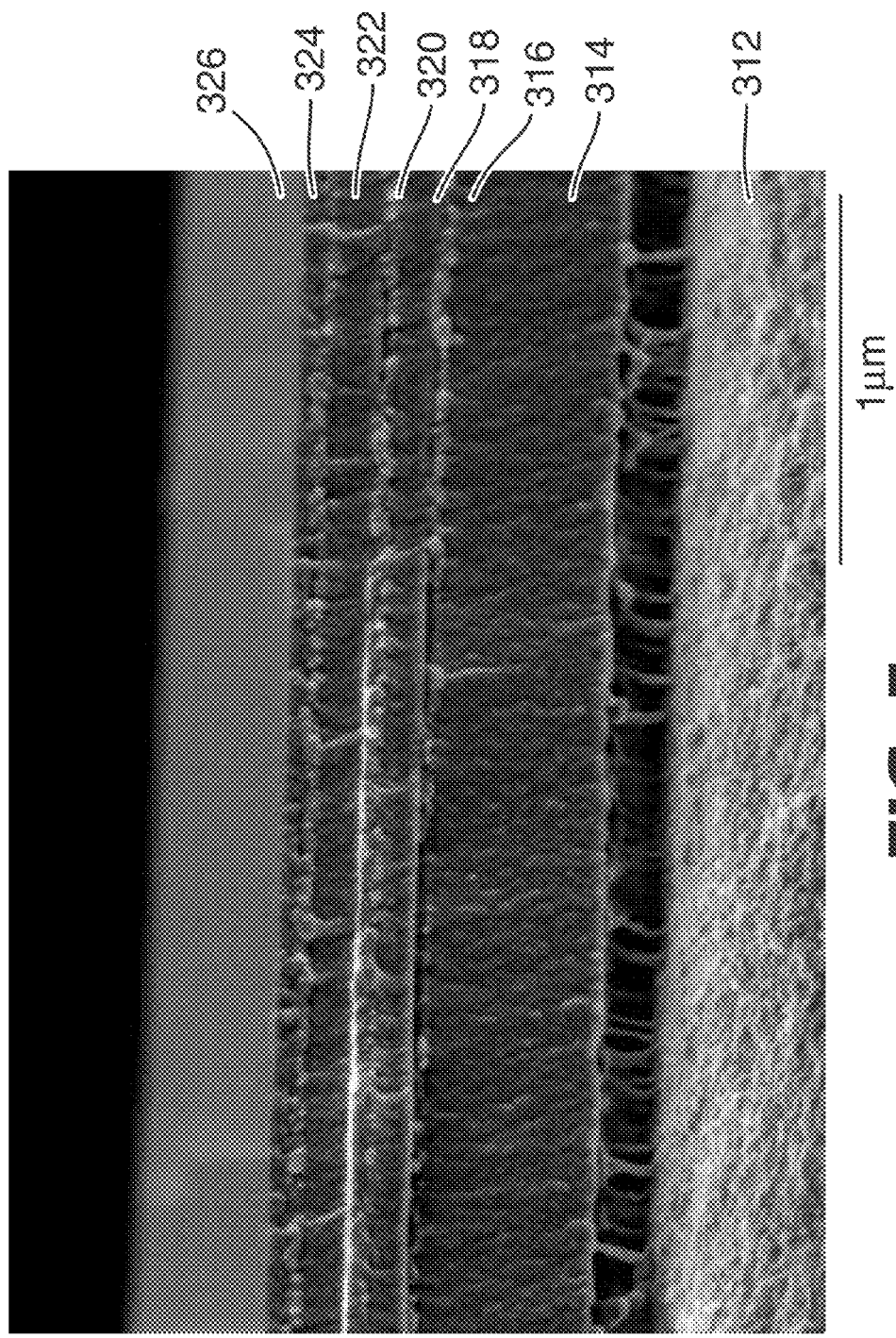
FIG. 5 is a photomicrograph of a disclosed barrier assembly.

The barrier assembly of Example 1 was immersed in liquid nitrogen, fractured in half and examined in cross-section using a scanning electron microscope. FIG. 5 shows the resulting photomicrograph. Support 312, first polymer layer 314, visible light-transmissive inorganic barrier layers 316, 320 and 324, second polymer layers 318 and 322 and third polymer layer 326 can clearly be seen in FIG. 5.

EXAMPLE 2

A seven layer stack was prepared in the same manner as Example 1, but using SR-368D mixed acrylate mixture (commercially available from Sartomer Co. as a 50:50 mixture of SR-351 trimethylolpropane triacrylate and SR-368 tris (2-hydroxyethyl) isocyanurate triacrylate) and using no plasma treatment in the formation of Layers 3, 5, and 7. The estimated Tg of SR-368D is 167° C., based on an arithmetic average of the 62° C. Tg of SR-351 and the 272° C. Tg of SR-368.

The resulting seven layer stack exhibited an average spectral transmission Tvis=68% measured at a 30° angle of incidence, and a WVTR (determined at 50° C. and 100% RH) that was below the 0.005 $g/m^2$/day lower detection limit rate of the WVTR testing system.

EXAMPLE 3

A seven layer stack was prepared in the same manner as Example 1, but using MELINEX™ 617 polyethylene terephthalate ("PET") film substrate (commercially available from DuPont-Teijin Films, Tg=70° C.) and different acrylates. Tripropylene glycol diacrylate ("TRPGDA", commercially available from UCB Chemicals, Tg=62° C.) was used as the Layer 1 acrylate. A mixture containing 97% TRPGDA and 3% EBECRYL 170 acrylated acidic adhesion promoter and having an estimated Tg=62° C., was used to form Layers 3, 5 and 7.

The resulting seven layer stack exhibited an average spectral transmission Tvis=71% measured at a 30° angle of incidence, and a WVTR (determined at 50° C. and 100% RH) of 0.036 g/m²/day.

EXAMPLE 4

Heat Stabilized PET Substrate

A seven layer stack was prepared in the same manner as Example 1, but using MELINEX™ ST725 heat stabilized PET film substrate (commercially available from DuPont-Teijin Films, Tg=78° C.), 100% IRR-214 acrylate without the EBECRYL 170 acrylated acidic adhesion promoter for each of Layers 1, 3, 5 and 7, and a plasma treatment performed at 2000 W using a silicon cathode and the Layer 2 argon/oxygen gas mixture while depositing Layers 3, 5, and 7.

The resulting seven layer stack exhibited an average spectral transmission Tvis=77% measured at a 30° angle of incidence, and a WVTR (determined at 60° C. and 100% RH) of 0.006 g/m²/day.

EXAMPLE 5

Effect of Substrate Tg on WVTR

Several substrates having various glass transition temperatures were covered with a three layer stack of SiAlO inorganic oxide and a commercial barrier polymer (SARAN™ F-278, commercially available from Dow Chemical Company) arranged in an inorganic oxide/barrier polymer/inorganic oxide configuration. As a preliminary step, sections of poly methyl pentene, polypropylene, PET and poly ether sulfone film substrates were spliced together end-to-end to make a single roll. The individual inorganic oxide and barrier polymer layers were formed on these substrates as follows:

(Layer 1) The spliced roll was loaded into a roll-to-roll sputter coater. The deposition chamber was pumped down to a pressure of 2×10⁻⁶ Torr. A 60 nm thick SiAlO inorganic oxide layer was deposited atop the substrate films by reactively sputtering a Si—Al (95/5) target (commercially available from Academy Precision Materials) using 2 kW and 600V, a gas mixture containing 51 sccm argon and 30 sccm oxygen at a pressure of 1 millitorr, and a web speed of 0.43 meters/minute.

(Layer 2) The oxide coated web was removed from the vacuum coater. A 10% solution of Saran F278 polymer in a 65/35 v/v mixture of tetrahydrofuran and toluene was continuously coated over Layer 1 using a Model CAG-150 microgravure coater (commercially available from Yasui-Seiki Co.) fitted with a 150R knurl roll operated at a 6.1 m/min web speed. The solvent was evaporated in the drying portion of the coater at a temperature of 80° C.

(Layer 3) The polymer coated web was loaded into the vacuum coater. Using the same conditions as for Layer 1, a second SiAlO inorganic oxide layer was deposited atop Layer 2.

The WVTR of each section of the coated barrier assembly was then determined at 38° C. and 100% RH. The results are set out below in Table 1:

TABLE 1

| Substrate | Tg, ° C. | WVTR @ 38° C./100% RH, g/m²/day |
|---|---|---|
| PMP (poly methyl pentene) [1] | 29 | 4.76 |
| PP (Polypropylene) [2] | −30 to +20 | 2.35 |
| PET [3] | 70 | 0.281 |
| PES (Poly ether sulphone) [4] | 225 | 0.0825 |

[1] TPX film, commercially available from Westlake Plastics.
[2] Commercially available from Copol International.
[3] Commercially available from Teijin Corp.
[4] Commercially available from Westlake Plastics.

As shown by the PET and PES substrates in Table 1, WVTR values tended to decrease as substrate Tg increased. The PMP and PP substrates had Tg values below the WVTR test temperature, and thus their WVTR values may be affected somewhat differently than higher Tg substrates.

EXAMPLE 6

Effect of Polymer Layer Tg on WVTR

HSPE 100 0.1 mm PET film (commercially available from Teijin Films, Tg=70° C.) was covered with a series of four layer polymer/inorganic oxide/polymer/inorganic oxide stacks employing polymer layers having various glass transition temperatures. The inorganic oxide was ITO and the polymers were formed from the ingredients set out below in Table 2, with the amount of each ingredient being shown as parts by weight in the formulation:

TABLE 2

| | Formulation | | | | |
|---|---|---|---|---|---|
| Ingredient | 1 | 2 | 3 | 4 | 5 |
| SR-238 [1] | 17 | — | 5 | — | — |
| CD-406 [2] | — | 17 | — | — | — |
| SR-506 [3] | — | — | 13 | — | — |
| B-CEA [4] | 3 | 3 | 2 | — | 10 |
| LC242 [5] | — | — | — | 20 | — |
| EBECRYL ™ 629 [6] | — | — | — | — | 85 |
| 1-methoxy-2-propanol | 75.6 | 75.6 | 75.6 | 75.6 | 360 |
| Methyl ethyl ketone | 113.4 | 113.4 | 113.4 | 113.4 | 540 |
| IRGACURE 184 [7] | 1 | 1 | 1 | 1 | 5 |

[1] 1,6-hexanediol diacrylate (commercially available from Sartomer Co., Tg = 43° C.).
[2] Cyclohexane dimethanol diacrylate esters (commercially available from Sartomer Co., Tg = 110° C.).
[3] Isobornyl acrylate (commercially available from Sartomer Co., Tg = 88° C.).
[4] β-carboxyethyl acrylate (commercially available from UCB Chemicals Corp.)
[5] Liquid crystal polymer (PALIOCOLOR ™ LC 242, commercially available from BASF Corp., Tg not available).
[6] Epoxy novolac diacrylate diluted with 30% trimethylolpropane triacrylate and 5% hydroxyethyl methacrylate (commercially available from UCB Chemicals Corp.).
[7] 1-hydroxycyclohexylphenylketone photoinitiator (commercially available from Ciba Specialty Chemicals).

(Layer 1) The five formulations shown in Table 2 were coated on successive sections of the PET film substrate using a Model CAG-150 microgravure coater and a 150R knurl at a line speed of 6.1 m/min. The coatings were cured using a 6 kW Fusion H bulb (commercially available from Fusion UV Systems) operating at 100% power.

(Layer 2) The coated film substrate was loaded into a sputter coater and pumped down to a base pressure of 2×10⁻⁶ Torr. A 40 nm thick ITO inorganic oxide layer was deposited atop the Layer 1 formulations using 300 W and 420 V and a 90/10 tin oxide/indium oxide target (commercially available from Arconium Specialty Alloys), a gas mixture containing 30 sccm argon and 8 sccm oxygen at a pressure of 4 millitorr, and a web speed of 0.127 meters/minute.

(Layer 3 and Layer 4) Using the same conditions as for Layer 1 and Layer 2 respectively, a second polymer layer was coated atop Layer 2 to form Layer 3 and a second ITO layer was deposited atop Layer 3 to form Layer 4.

The WVTR of each section of the coated barrier assembly was then determined at 50° C. and 100% RH. The results are set out below in Table 3:

TABLE 3

| Polymer Layer | Tg, ° C. | WVTR @ 50° C./100% RH, g/m²/day |
|---|---|---|
| Formulation 1 [1] | 43 | 1.08 |
| Formulation 2 [2] | 110 | 0.63 |
| Formulation 3 [3] | 93.5 | 1.47 |
| Formulation 4 [4] | — | 0.1 |
| Formulation 5 [5] | 122 | 0.09 |

[1] Polymer of 1,6-hexanediol diacrylate and β-carboxyethyl acrylate.
[2] Polymer of cyclohexane dimethanol diacrylate esters and β-carboxyethyl acrylate.
[3] Polymer of isobornyl acrylate and β-carboxyethyl acrylate.
[4] Polymer of PALIOCOLOR™ LC 242.
[5] Polymer of epoxy novolac diacrylate and β-carboxyethyl acrylate.

As shown by Formulations 1, 2 and 5 in Table 3, WVTR values tended to decrease as the polymer Tg increased. The polymers of Formulations 1, 2 and 5 were made from substantial amounts of multifunctional monomers or oligomers. Somewhat different behavior was observed for Formulations 3 and 4. Formulation 3 contained 75% monofunctional monomers and thus was not crosslinked in the same fashion as Formulations 1, 2 and 5. Formulation 4 was based on a liquid crystal polymer obtained from UV curing a liquid crystal diacrylate monomer and thus may not behave in the same fashion as Formulations 1, 2 and 5.

EXAMPLE 7

Laminated Barrier Construction

A laminated barrier assembly was assembled using an optical adhesive to adhere together in face-to-face fashion two barrier assemblies having six layer stacks on PET substrates. The completed laminated barrier assembly had a PET/polymer 1/SiAlO/polymer 2/SiAlO/polymer 2/SiAlO/optical adhesive/SiAlO/polymer 2/SiAlO/polymer 2/SiAlO/polymer 1/PET configuration. The barrier assemblies were formed and laminated together as follows:

(Layer 1) HSPE 50 0.05 mm PET film (commercially available from Teijin, Tg=70° C.) was coated with Formulation 6 (shown below in Table 4) using a Model CAG-150 microgravure coater and a 110R knurl at 6.1 m/min. The coating was cured using a Fusion F600 H bulb running at 100% power, to provide a layer identified as "Polymer 1". Polymer 1 had a 122.8° C. Tg as determined using photodifferential scanning calorimetry ("photo DSC").

(Layer 2) Using the conditions described for the SiAlO inorganic oxide layer in Example 5, a 60 nm thick SiAlO inorganic oxide layer was deposited atop Layer 1.

(Layer 3) Using the conditions described for Layer 1 but with a 4.6 m/min coating speed, Layer 2 was coated with Formulation 7 (shown below in Table 4) and cured to provide a layer identified as "Polymer 2". Polymer 2 has a 90° C. Tg.

(Layer 4, Layer 5 and Layer 6). Using the same conditions as for Layer 2 and Layer 3 respectively, a second SiAlO layer was deposited atop Layer 3 to form Layer 4, a second layer of Polymer 2 was coated atop Layer 4 to form Layer 5, and a third layer of SiAlO was deposited atop Layer 5 to form Layer 6, thereby providing a barrier assembly having a PET/Polymer 1/SiAlO/Polymer 2/SiAlO/Polymer 2/SiAlO configuration.

TABLE 4

| | Formulation | |
|---|---|---|
| Ingredient | 1 | 2 |
| EBECRYL™ 629 | 145.5 | — |
| β-CEA | 37.5 | — |
| IRGACURE 184 | 9.03 | — |
| UVI-6974 [1] | — | 2.25 |
| EHPE3150 [2] | — | 42.75 |
| MEK | 972 | 405 |

[1] CYRACURE™ UVI-6974 triarylsulfonium hexafluoroantimonate (commercially available from Ciba Specialty Chemicals).
[2] Polyester EHPE3150 solid alicyclic epoxy resin (commercially available from Daicel Chemical Industries, Tg = 90° C.).

The resulting coated barrier assembly roll was split into two rolls and laminated together in face-to-face fashion using 3M™ 8141 optically clear laminating adhesive (commercially available from 3M Co.) and a roll-to-roll laminator. The WVTR values were determined for the non-laminated barrier assemblies at 38° C. and 100% RH and for the laminated barrier assemblies at 38° C./100% RH and 50° C./100% RH. The results are set out below in Table 5:

TABLE 5

| Barrier Assembly Configuration | WVTR, g/m²/day @ 100% RH and 38° C. or 50° C. |
|---|---|
| PET/Polymer 1/SiAlO/Polymer 2/SiAlO/Polymer 2/SiAlO | 0.041 (38° C.) |
| PET/polymer 1/SiAlO/polymer 2/SiAlO/polymer 2/SiAlO/optical adhesive/SiAlO/polymer 2/SiAlO/polymer 2/SiAlO/polymer 1/PET | <0.005 (38° C.) |
| PET/polymer 1/SiAlO/polymer 2/SiAlO/polymer 2/SiAlO/optical adhesive/SiAlO/polymer 2/SiAlO/polymer 2/SiAlO/polymer 1/PET | <0.005 (50° C.) |

As shown by the results in Table 5, the face-to-face lamination step provided a reduction in WVTR. The WVTR remained below the 0.005 g/m²/day lower detection limit rate of the MOCON PERMATRAN-W 3/31 WVTR testing system at both 38° C. and 50° C. measurement temperatures.

EXAMPLE 8

OLED Device

Samples from the barrier assembly of Example 1 were again loaded into the roll-to-roll vacuum processing chamber, for deposition of a top-surface ITO conductor layer formed as follows:

(Layer 8) The ITO was sputter deposited using the same conditions as for Layer 6, but using a 0.19 meters/minute web speed to provide a 138 nm thick ITO layer deposited atop the Layer 7 acrylate.

The resulting top-surface conducting barrier was cut into 22×22 mm squares using an X-ACTO™ knife (commercially available from Hunt Corporation). After rinsing with acetone and air-drying, the squares were cleaned in an oxygen plasma using a MICRO-RIE™ Series 80 plasma system (commercially available from Technics, Inc.) and 4 minutes exposure at 50 watts power and 200 millitorr oxygen pressure. An aqueous 1% solids solution of BAYTRON™ P 4083 polythiophene (commercially available from Bayer Corporation) was spun coat at 2500 rpm for 30 seconds onto the cleaned squares. The squares were held in place on the spin coater vacuum chuck by first placing a 22×22×1 mm glass slide on the vacuum chuck, applying vacuum to hold the glass slide in place, adding a drop of methanol to the top of the glass slide, placing the cleaned square atop the methanol and aligning the edges of the square with the edges of the glass slide. The methanol filled the space between the glass slide and the square and held the square in place during the spin coating operation. The coated squares were dried on a 70° C. hot plate under a nitrogen atmosphere.

The coated squares were transferred to a bell jar evaporation chamber and evacuated to about $10^{-6}$ torr. The following layers were thermally vapor-deposited in sequence on the coated squares through a shadow mask containing a 19.5 mm square opening:

(Layer 1) A 2245 Å thick layer of 4,4',4''-tris(N-(3-methylphenyl)-N-phenylamino)triphenylamine, ("MTDATA", commercially available from H. W. Sands Corp.) doped with 7% tetrafluorotetracyanoquinodimethane ("FTCNQ", commercially available from Tokyo Kasei Kogyo Co., Tokyo, Japan).

(Layer 2) A 300 Å thick layer of N,N'-di(naphthalen-1-yl)-N,N'-diphenylbenzidine ("alpha-NPB", commercially available as OPD7534 from H. W. Sands Corp.).

(Layer 3) A 300 Å thick layer of tris(8-hydroxyquinolinolato)aluminum ("AlQ$_3$", commercially available from H. W. Sands Corp) doped with 1% (10-(2-Benzothiazolyl)-2,3,6,7-tetrahydro-1,1,7,7-tetramethyl 1-1H,5H,11H-[1]benzopyrano[6,7,8-ij]quinolizin-11-one ("C545T" dye, commercially available from Eastman Kodak Co.).

(Layer 4) A 200 Å thick layer of AlQ$_3$.

The vapor-coated squares were transferred to glove box that contained a thin film evaporation chamber ("Edwards 500", commercially available from BOC Edwards) for the thermal deposition of cathodes. A 1000 Å thick calcium layer (using a target commercially available from Alfa-Aesar Co.) and a 2000 Å thick silver layer (using a target commercially available from Alfa-Aesar Co.) were sequentially deposited at about $10^{-7}$ torr onto the squares through a metal shadow mask having a 1 cm$^2$ circular opening disposed such that the cathode was deposited in the approximate center of the squares. Green light was emitted when about 4 to 9 volts DC was passed through the completed OLED device by contacting the ITO anode with an alligator clip and the Ca/Ag cathode with a fine gold wire.

The devices were encapsulated with copper foil as described in copending U.S. patent application Ser. No. 10/324,585 filed Dec. 19, 2002. An approximately 50×100 mm piece of 3M™ Thermo-Bond Film 845 EG thermal laminating film (0.06 mm adhesive thickness) was marked on its release liner side with a 2×8 grid of 25 mm squares. A 6 mm circular hole was cut in the center of each 25 mm square using a hand-held paper punch. The perforated thermal laminating film was placed onto an approximately 125×75 mm piece of 0.05 mm thick Cu foil (commercially available from McMaster-Carr Supply Co.) with the adhesive side contacting the foil, then placed on a 76×229×0.64 mm aluminum plate (commercially available from the Q-panel Company) with the release liner side contacting the aluminum plate. The resulting assembly was fed three times in succession through a TDE Systems Model HL-406 2-roll thermal laminator (commercially available from Kmart Corp.) operated at approximately 102° C. to laminate the adhesive film to the Cu foil and deform the foil into the 6 mm hole in the adhesive.

The laminated Cu foil was removed from the aluminum carrier plate, cut with scissors into 25 mm squares, and brought into the glove box containing the green emitting OLED devices. The 25 mm squares of laminated Cu foil were trimmed with scissors to about 20 mm square such that the 6 mm hole in the adhesive layer remained at the approximate center of the square. The release liner was then removed and the exposed adhesive layer placed against the cathode side of one of the 22 mm square OLED devices with the 6 mm hole through the adhesive layer approximately centered over the cathode of the OLED device, and with the laminated Cu foil square rotated by 45° with respect to the OLED substrate such that the corners of the laminated Cu foil square lined up with and extended beyond the approximate midpoint of the edges of the OLED substrate. The resulting assemblies were held together using tweezers and placed on a 100° C. hotplate for about 20 seconds to cause the laminated Cu foil to adhere to the OLED substrate. The corners of the Cu foil were then folded over the front of the OLED device and laminated thereto in the inert nitrogen atmosphere of the glove box by passing the resulting assembly through a BESTECH™ Model 2962 2 roll thermal laminator (commercially available from Rose Art Industries) operated at about 100° C. Upon cooling, anode connections to the encapsulated OLED were made by contacting an exposed ITO portion on a corner of the device and cathode connections were made by contacting the Cu foil. When current was applied, green light was emitted from the device.

Various modifications and alterations of this invention will be apparent to those skilled in the art without departing from this invention. This invention should not be restricted to that which has been set forth herein only for illustrative purposes.

The invention claimed is:

1. A barrier assembly, comprising a first film assembly and a second film assembly laminated together with a visible light-transmissive adhesive, wherein the first film assembly comprises a first flexible visible light-transmissive support layer overcoated with a first polymer layer having a Tg greater than or equal to that of HSPET and further overcoated with a first visible light-transmissive inorganic barrier layer, wherein the second film assembly comprises a second flexible visible light-transmissive support layer overcoated with a second polymer layer having a Tg greater than or equal to that of HSPET and further overcoated with a second visible light-transmissive inorganic barrier layer, and wherein the barrier assembly has an oxygen transmission rate less than 0.005 cc/m$^2$/day at 23° C. and 90% RH.

2. A display or illuminating device comprising, a moisture- or oxygen-sensitive light source or light valve at least partially covered with a barrier assembly comprising a first film assembly and a second film assembly laminated together with a visible light-transmissive adhesive, wherein the first film assembly comprises a first flexible visible light-transmissive layer overcoated with a first polymer layer having a Tg greater than or equal to that of HSPET and further overcoated with a first visible light-transmissive inorganic barrier layer, and wherein the second film assembly comprises a second flexible visible light-transmissive layer overcoated with a second polymer layer having a Tg greater than or equal to that of HSPET and further overcoated with a second visible light-transmissive inorganic barrier layer.

3. A process for making a barrier assembly, comprising the steps of:

making a first film assembly by:
providing a first flexible visible light-transmissive substrate;

forming a first polymer layer having a Tg greater than or equal to that of HSPET atop the first substrate; and forming a first visible light-transmissive inorganic barrier layer atop the first polymer layer;

making a second film assembly by:

provisioning a second flexible visible light-transmissive substrate;

forming a second polymer layer having a Tg greater than or equal to that of HSPET atop the second substrate;

forming a second visible light-transmissive inorganic barrier layer atop the second polymer layer; and laminating the first film assembly to the second film assembly using a visible light-transmissive adhesive, wherein the barrier assembly has an oxygen transmission rate less than 0.005 cc/m$^2$/day at 23° C. and 90% RH.

* * * * *